United States Patent
Hayakawa et al.

(10) Patent No.: US 7,468,542 B2
(45) Date of Patent: Dec. 23, 2008

(54) MAGNETORESISTIVE DEVICE AND NONVOLATILE MAGNETIC MEMORY EQUIPPED WITH THE SAME

(75) Inventors: Jun Hayakawa, Kokubunji (JP); Hideo Ohno, Sendai (JP); Shoji Ikeda, Sendai (JP)

(73) Assignee: Hitachi, Ltd., Tokyo (JP)

( * ) Notice: Subject to any disclaimer, the term of this patent is extended or adjusted under 35 U.S.C. 154(b) by 104 days.

(21) Appl. No.: 11/493,892

(22) Filed: Jul. 27, 2006

(65) Prior Publication Data

US 2007/0025029 A1 Feb. 1, 2007

(30) Foreign Application Priority Data

Jul. 28, 2005 (JP) ............................. 2005-219526
Jun. 30, 2006 (JP) ............................. 2006-181979

(51) Int. Cl.
*H01L 29/82* (2006.01)
(52) U.S. Cl. ................... 257/421; 257/422; 360/324.2; 365/149
(58) Field of Classification Search ................. 257/2–5, 257/421–427; 360/324.2; 438/900; 365/158
See application file for complete search history.

(56) References Cited

U.S. PATENT DOCUMENTS

| | | | |
|---|---|---|---|
| 5,695,864 A | 12/1997 | Slonczewski | |
| 6,097,625 A * | 8/2000 | Scheuerlein | 365/171 |
| 6,603,677 B2 | 8/2003 | Redon et al. | |
| 7,110,284 B2 | 9/2006 | Hayakawa et al. | |
| 2001/0043986 A1* | 11/2001 | Saito et al. | 427/130 |
| 2004/0041183 A1* | 3/2004 | Slaughter et al. | 257/295 |
| 2006/0056115 A1* | 3/2006 | Djayaprawira et al. | 360/324.2 |
| 2006/0093862 A1* | 5/2006 | Parkin | 428/811.1 |
| 2006/0128038 A1* | 6/2006 | Pakala et al. | 438/4 |

FOREIGN PATENT DOCUMENTS

| | | |
|---|---|---|
| CN | 1606093 A | 4/2005 |
| JP | 2006-269530 | 10/2006 |

OTHER PUBLICATIONS

Kubota et al, Current Induced Magnetization switching in Magnetic Tunnel Junction with MgO (001) Tunnel Barrier, Intermag Asia Magnetics Conference, 2005, Apr. 4-8 2005, Digests of the IEEE International pp. 1013-1014.*

(Continued)

*Primary Examiner*—Jerome Jackson, Jr.
*Assistant Examiner*—Jami M Valentine
(74) *Attorney, Agent, or Firm*—Antonelli, Terry, Stout & Kraus, LLP.

(57) ABSTRACT

A fast and very low-power-consuming nonvolatile memory. A nonvolatile magnetic memory includes a high-output tunnel magnetoresistive device, in which spin-transfer torque is used for writing. A tunnel magnetoresistive device has a structure such that a ferromagnetic film of a body-centered cubic structure containing Co, Fe, and B, a MgO insulator film of a rock-salt structure oriented in (100), and a ferromagnetic film are stacked.

17 Claims, 6 Drawing Sheets

OTHER PUBLICATIONS

Park et al. Annealing effects on structural and transport properties of rf-sputtered CoFeB / MgO / CoFeB magnetic tunnel junctions., Journal of Applied Physics, 99, 08A901, (2006).*

J. C. Slonczewski, Current Driven Excitation of Magnetic Multilayers, J. Magn. Magn. Mater. 159, L1 (1996).*

Hayakawa et al., Arxiv Public Pre-Print Server: cond-mat/0504051 available to the public Apr. 3, 2005 at http://arxiv.org/ftp/cond-mat/papers/0504/0504051.pdf.*

Ashcroft and Mermin. Solid State Physics, Saunders College Publishing, 1976.*

Petej et al. Magnetism: Molecules to Materials III. Eds Miller and Drillon 2002, Wiley-VCH Verlag GmbH, pp. 260-261.*

T.C. Anthony et al., Magnetoresistance of Symmetric Spin Valve Structures, IEEE Trans. Magn. 30 (1994), p. 3819.*

Wolf et al. (Spintronics: A Spin-Based Electronics Vision for the Future, Science 294, 1488 (2001).*

Hayakawa et al. (Arxiv Public Pre-Print Server: cond-mat/0504051 available to the public Apr. 3, 2005 at http://arxiv.org/ftp/cond-mat/papers/0504/0504051.pdf).*

Ashcroft and Mermin (Solid State Physics, Saunders College Publishing, 1976, p. 80).*

Journal of Magnetism and Magnetic Materials 139 (1995) L231-L234.

Nature Material 3, 868 (2004).

Chinese Office Action dated Aug. 1, 2008, for Application No. 2006101089234.

D. D. Djayaprawira, et al., "230% room-temperature magnetoresistance in CoFeB/MgO/CoFeB magnetic tunnel junctions", *Applied Physics Letters*, vol. 86, No. 092502, 2005.

* cited by examiner

MAGNETORESISTIVE DEVICE AND NONVOLATILE MAGNETIC MEMORY EQUIPPED WITH THE SAME

CLAIM OF PRIORITY

The present application claims priority from Japanese application JP 2005-219526 filed on Jul. 28, 2005 and JP 2006-181979 filed on Jun. 30, 2006, the contents of which are hereby incorporated by reference into this application.

BACKGROUND OF THE INVENTION

1. Field of the Invention

The present invention relates to a high-output tunnel magnetoresistive device and a low-power-consumption nonvolatile magnetic memory equipped with the same.

2. Background Art

Conventional tunnel magnetoresistive devices employ a tunnel film stack that includes an insulator film comprised of an oxide of Al (T. Miyazaki and N. Tezuka, J. Magn. Magn. Mater. 139, L231 (1995)). Because Al oxides are amorphous, they have been unable to provide sufficient electric output signals for industrial applications. Recently, it has been reported that a magnetoresistance ratio several times greater than that of the aforementioned tunnel magnetoresistive device employing an Al oxide in the insulator was obtained in a tunnel magnetoresistive device employing magnesium oxide in the insulator film (S. Yuasa. et al., Nature Material 3, 868 (2004)). Conventional nonvolatile magnetic memories are comprised of memory cells having MOSFETs on which tunnel magnetoresistive devices are formed. The MOSFETs are used for switching, and the direction of magnetization of the tunnel magnetoresistive device is rotated by means of a spatial magnetic field induced by a current upon energization of a bit line and a word line so as to write information. Readout of information is conducted based on an output voltage of the tunnel magnetoresistive device. In addition to the above magnetization rotation based on the current-induced spatial magnetic field, there is also a so-called spin-transfer torque magnetization switching, which is also known as current induced magnetization switching. In this system, a current is caused to flow directly through a magnetoresistive device so as to rotate magnetization, as disclosed in U.S. Pat. No. 5,695,864 or JP Patent Publication (Kokai) No. 2002-305337 A.

Non-patent Document 1: J. Magn. Magn. Mater. 139, L231 (1995)

Non-patent Document 2: Nature Material 3, 868 (2004)

Patent Document 1: U.S. Pat. No. 5,695,864

Patent Document 2: JP Patent Publication (Kokai) No. 2002-305337 A

SUMMARY OF THE INVENTION

For the realization of a low-power-consumption nonvolatile magnetic memory, it is vital to develop technologies capable of achieving higher output of the tunnel magnetoresistive device and capable of writing the tunnel magnetoresistive device based on spin-transfer torque magnetization switching.

It is therefore an object of the invention to provide a tunnel magnetoresistive device and nonvolatile magnetic memory by which the aforementioned needs can be satisfied.

In order to achieve the above object, in accordance with the invention, a compound ferromagnetic film having a body centered cubic structure of Co or Fe including B is used in a ferromagnetic film of a tunnel magnetoresistive device. Further, a magnesium oxide is used in an insulator film.

The invention provides a tunnel magnetoresistive device comprising an insulator film, and first and second ferromagnetic films between which the insulator film is disposed, wherein the first ferromagnetic film comprises a film of a body-centered cubic structure containing Co, Fe, and B, and wherein the insulator film comprises a MgO film of a rock-salt-structure oriented in (100). The second ferromagnetic film may comprise a film of a body-centered cubic structure containing Co, Fe, and B. Preferably, the first ferromagnetic film has a Co-to-Fe composition ratio (atm %) of 50:50 to 70:30. In the tunnel magnetoresistive device in which MgO is used in the insulator film, the body-centered cubic structure can stably exist, as shown in FIG. 8. By containing more Co than Fe, the spin polarization that contributes to the tunneling magnetoresistance ratio can be improved. Preferably, the ferromagnetic film of the body-centered cubic structure containing Co, Fe, and B has a film thickness of 3 nm or smaller and contains 10 to 30 atm % of B.

The invention also provides a magnetic memory comprising a tunnel magnetoresistive device, and a switching element for controlling the ON/OFF of a current that flows through the tunnel magnetoresistive device, wherein the tunnel magnetoresistive device comprises an insulator film, first and second ferromagnetic films between which the insulator film is disposed, wherein the first ferromagnetic film comprises a film of a body-centered cubic structure containing Co, Fe, and B, wherein the insulator film comprises a MgO film of a rock-salt structure oriented in (100).

The invention further provides a magnetic random access memory comprising a plurality of magnetic memory cells and a means for selecting a desired magnetic memory cell, wherein the magnetic memory cells include a tunnel magnetoresistive device in which a first ferromagnetic film of a body-centered cubic structure containing Co, Fe, and B, a MgO insulator film of a rock-salt structure oriented in (100), and a second ferromagnetic film are stacked.

In accordance with the invention, a high-output tunnel magnetoresistive device can be obtained. By equipping a magnetic memory with the tunnel magnetoresistive device, a fast and very low-power-consuming nonvolatile memory can be provided.

DESCRIPTION OF THE PREFERRED
EMBODIMENTS OF THE INVENTION

In the following, embodiments of the invention will be described with reference to the drawings.

EXAMPLE 1

Figure 1:
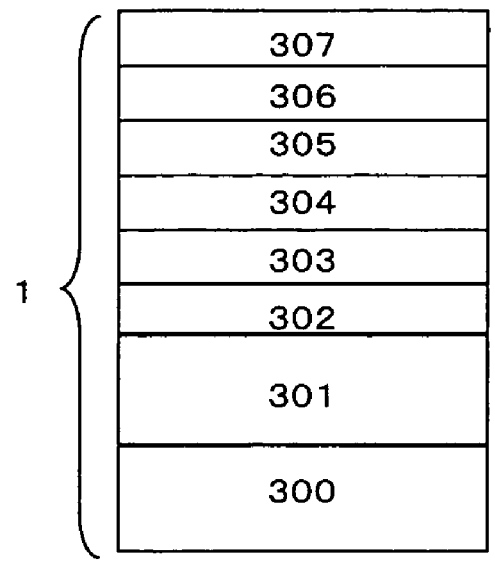
FIG. 1 shows a first example of a tunnel magnetoresistive device according to the invention.

FIG. 1 shows a schematic cross section of an example of a tunnel magnetoresistive device of the invention. A tunnel magnetoresistive device 1 is formed by stacking an orientation control film 300, an antiferromagnetic film 301, a ferromagnetic film 302, a non-ferromagnetic film 303, a ferromagnetic film 304, an insulator film 305, a ferromagnetic film 306, and a protection film 307. The device is thermally processed at an appropriate temperature so as to optimize its magnetoresistance ratio. The tunnel magnetoresistive device according to the present embodiment was prepared by a sputtering process.

Figure 8:
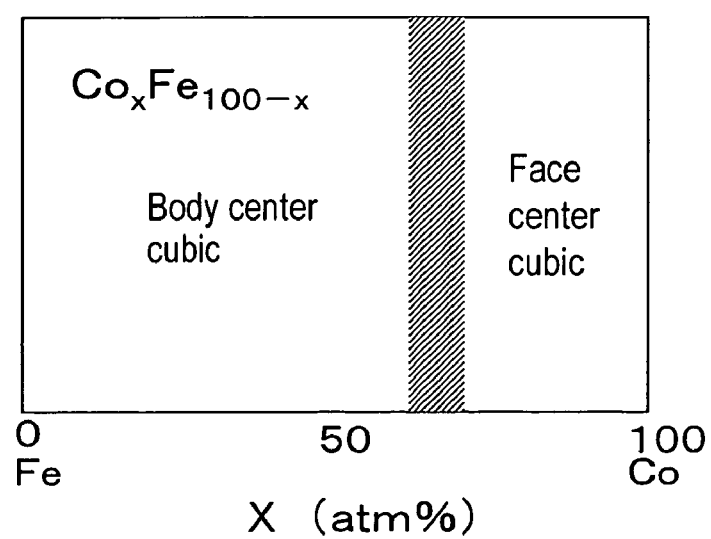
FIG. 8 shows a crystal structure of a composition $Co_x Fe_{100-x}$.

While the orientation control film 300 was formed from NiFe (5 nm), other material may be used that are capable of improving the orientation of the aforementioned antiferromagnetic film 301 and achieving stable anti-ferromagnetic coupling, such as a double-layer film of Ta (5 nm)/NiFe (5 nm), for example. While the antiferromagnetic film 301 employed MnIr (8 nm), the film thickness may be selected from a range of 5 to 15 nm. Further, stable anti-ferromagnetic coupling may also be realized with an antiferromagnetic film comprised of a Mn compound, such as MnPt or MnFe. For the ferromagnetic film 302, CoFe (2 nm) was used. For the non-ferromagnetic film 303, Ru (0.8 nm) was used. And for the ferromagnetic film 304, CoFeB (3 nm) having a body centered cubic structure was used. The composition ratio of the CoFe in the ferromagnetic film 302 was selected such that the Co composition was mainly between 50 to 90 atm %. In this composition range, a stable anti-ferromagnetic coupling with the aforementioned antiferromagnetic film can be realized. The materials for the ferromagnetic film 302, non-ferromagnetic film 303, and ferromagnetic film 304 were selected such that the magnetization of the ferromagnetic film 302 and that of the ferromagnetic film 304 form an anti-ferromagnetic coupling. Their film thicknesses were selected such that the magnitude of magnetization of the ferromagnetic film 302 and that of the ferromagnetic film 304 were equal. The insulator film 305, which employed a magnesium oxide crystalline film having a rock-salt structure, is a film oriented in the (100) direction. The film thickness of the insulator film was in the range of 0.8 nm to 3 nm. For the ferromagnetic film 306, CoFeB (3 nm) having a body centered cubic structure was employed. Preferably, the composition of Co and Fe in CoFeB of the ferromagnetic film 304 and the ferromagnetic film 306 is in the range of 50:50 to 70:30. In this composition range, as shown in FIG. 8, the body-centered cubic structure can stably exist. Further, in the tunnel magnetoresistive device 1 in which MgO is used in the insulator film 305, the spin polarization that contributes to the tunnel magnetoresistance ratio can be improved by containing more Co than Fe.

Table 1 shows examples of the composition of CoFeB and that of CoFe that can be used in the ferromagnetic films 304 and 306. In order to obtain a large TMR ratio in the tunnel magnetoresistive device 1, it is desirable to use CoFeB in the ferromagnetic films 304 and 306 and to have the Co composition range from 50 to 90 atm %. It is also possible, however, to have the composition ratio of Co relative to Fe in the range between 0 to 50 atm %. Although in the case of such Co composition the magnitude of the TMR ratio decreases as compared with the case where the Co composition is between 50 to 90 atm %, the dependency on the voltage applied to the tunnel magnetoresistive device tends to be improved. While the TMR ratio normally tends to decrease as the applied voltage increases, the ratio of such decrease can be reduced in half at a maximum when the Co composition is between 0 to 50 atm %.

The CoFeB of the above ferromagnetic film 304 and the ferromagnetic film 306 may be amorphous, or it may be crystallized in a heat process at an appropriate temperature. Regarding the composition ratio of CoFeB, the Co composition was used between 40 to 60 atm % and the B composition between 10 to 30 atm % such that a body centered cubic structure was obtained. Apart form CoFeB, the ferromagnetic film 306 may be comprised of a single layer film of CoFe, a single layer film of NiFe, or a double layer film of CoFe/NiFe or CoFeB/NiFe. In the present example, while the Co composition in CoFe was set to be 50 atm % at which the body centered cubic structure was stable, the composition may range between 50 to 90%. When the Co composition is large, the face-centered cubic lattice is stable and, while the tunnel magnetoresistance ratio decreases, good magnetic characteristics with a small coercivity for a magnetic free layer can be realized, and the threshold current density during spin-transfer torque magnetization switching can be varied depending on the magnitude of each magnetic moment. The protection film 307 was formed as a double-layer film of Ta (5 nm)/Ru (5 nm).

Using photolithography and ion milling for material processing, a tunnel magnetoresistive device having an area of 0.8 μm×1.6 μm was manufactured. The tunnel magnetoresistance ratio of the thus manufactured tunnel magnetoresistive device can be increased by a heat processing. When CoFeB was used for the ferromagnetic film 306, a tunnel magnetoresistance ratio of 250% was achieved by performing approximately one hour of heat processing at 375° C. or higher. In a range of thickness of the insulator film 305 between 0.8 nm and 3.0 nm, a tunnel magnetoresistance ratio of 100% or more was observed. It is possible to obtain a good magnetoresistance ratio of 150% or more even if the temperature of the heat processing is increased up to 400° C. In particular, it was confirmed that CoFeB is crystallized by a heat processing, and that when the crystallized CoFeB had a crystalline structure of the body centered cubic structure, the tunnel magnetoresistance ratio was maximized. While the aforementioned (100) oriented film of magnesium oxide can be formed on an amorphous ferromagnetic film by sputtering, if it is formed on a polycrystalline ferromagnetic film by sputtering, it is difficult to obtain a good (100) oriented film, with the tunnel magnetoresistance ratio remaining at a maximum of 50%. This shows that, when a tunnel magnetoresistance ratio of 200% or more is observed in a tunnel magnetoresistive device 1 including a ferromagnetic film 304 and a ferromagnetic film 306 that are comprised of crystalline CoFeB, and including an insulator film 305 comprised of a crystalline magnesium oxide with the (100) orientation, the ferromagnetic film 304 and the ferromagnetic film 306 upon film formation are definitely of noncrystalline CoFeB, and that such device has been manufactured through a heat process.

Figure 10:
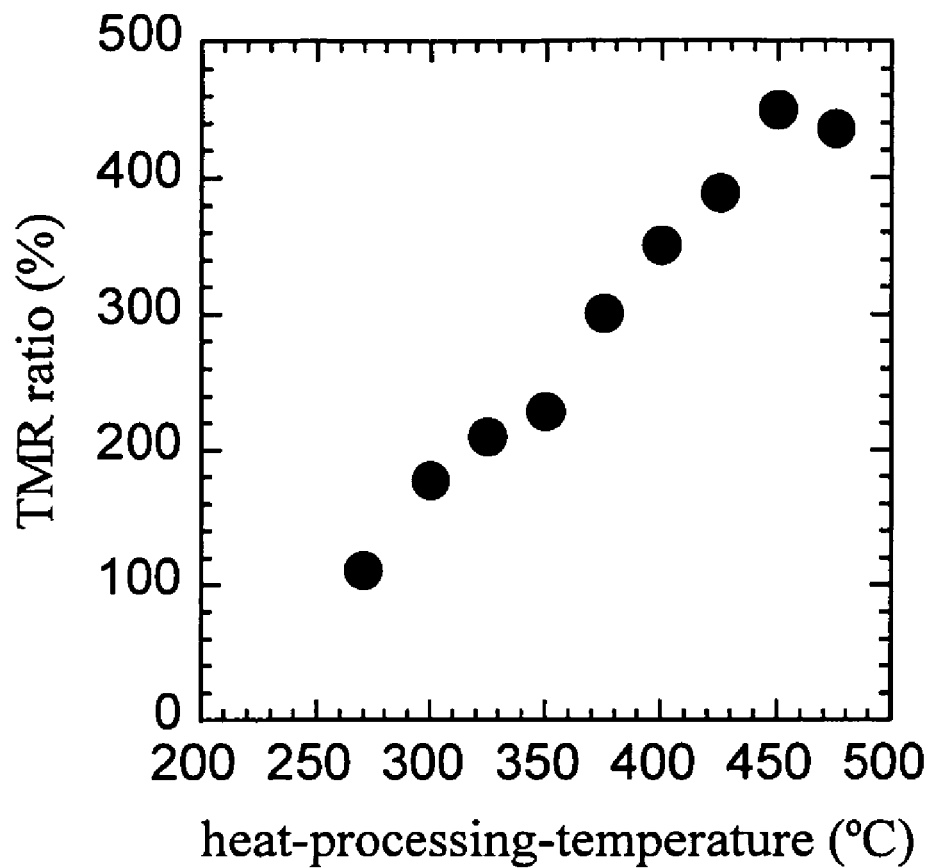
FIG. 10 shows the TMR ratio and the heat-processing-temperature dependency of the tunnel magnetoresistive device of the invention.

The tunnel magnetoresistive device 1 has a structure in which the ferromagnetic film 304 is CoFeB, the insulator film 305 is MgO, and the ferromagnetic film 306 is CoFeB, and in which the antiferromagnetic film 301 is not used. The tunnel magnetoresistive device 1 may employ a stacked structure in which a TMR ratio is obtained by taking advantage of the difference in the magnetic anisotropy or the magnitude of the coercivity between the ferromagnetic films 304 and 306. For example, when a stacked structure of Ta/CoFeB/MgO/CoFeB/Ta is used, the TMR ratio of 450% is obtained at the heat processing temperature of 450° C., as shown in FIG. 10, by selecting an appropriate film thickness for each film. The maximum TMR ratio can be obtained when the composition of CoFeB is such that Co:Fe:B is 40:40:20 (atm %). However, the composition of Co:Fe may be anywhere between 0 to 100 atm %, with the B composition ranging from 0 to 30 (atm %). Such composition ratio has the relationship [Co(100-x)Fe(x)] (100-y) B(y), $0 \leq x \leq 100$ (%), $0 \leq y \leq 30$ (%), as shown in Table 1, which shows the materials that can be used in the ferromagnetic films of the invention and examples of their composition. Other than Ta mentioned above, an amorphous film with a high melting point may also be validly used. In the case of this structure, it becomes possible to obtain an even higher TMR ratio at a high heat processing temperature because of the absence of thermal diffusion via Mn in an Mn compound, for example, that is used in the antiferromagnetic film 301.

TABLE 1

[Co(100-x)Fe(x)](100-y)B(y)
0<x<100(%), 0<y<30(%)
(Composition of CoFeB: which includes CoB, FeB)
Co(100-x)Fe(x)
(Composition of Co and Fe: which includes Fe, Co)
0<x<100(%)
[Co(100-x)Fe(x)](100-y)B(y)/Co(100-x)Fe(x)
Laminated film composed of two ferromagnetic films
0<x<100(%), 0<y<30(%)

The above-described method whereby a tunnel magnetoresistive device 1 is produced by causing the ferromagnetic film 304 and the ferromagnetic film 306, which are amorphous upon film formation, to be crystallized by a heat process differs from conventional methods. It is noted, however, that in a tunnel magnetoresistive device 1 in which a CoFe single layer film, a NiFe single layer film, or a CoFe/NiFe film is used in the ferromagnetic film 306, such ferromagnetic film 306 is crystalline from the time of film formation, and only the ferromagnetic film 304 is crystallized by the heat process. The maximum tunnel magnetoresistance ratio of tunnel magnetoresistive devices 1 in which the ferromagnetic film 306 was comprised of a CoFe single layer film, a NiFe single layer film, or a CoFe/NiFe film was 200%, 40%, and 150%, respectively.

EXAMPLE 2

Figure 2:
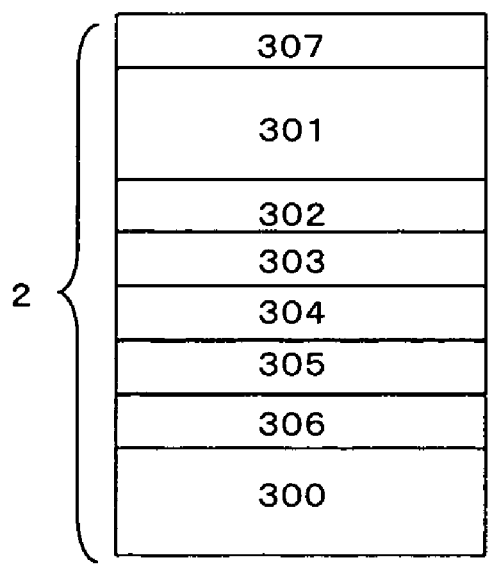
FIG. 2 shows a second example of the tunnel magnetoresistive device according to the invention.

FIG. 2 shows a schematic cross section of another example of the tunnel magnetoresistive device of the invention. A tunnel magnetoresistive device 2 was formed by stacking an orientation control film 300, a ferromagnetic film 306, an insulator film 305, a ferromagnetic film 304, a non-ferromagnetic film 303, a ferromagnetic film 302, an antiferromagnetic film 301, and a protection film 307. In particular, when CoFeB is used in the ferromagnetic film 306 and the ferromagnetic layer film 304, the resultant crystal structure is a body centered cubic structure. The insulator film 305 is MgO having a rock-salt structure highly oriented in (100).

In the tunnel magnetoresistive device 2 of the present example, because the ferromagnetic film 306 is formed adjacent to the oriented insulator film 300 and has an excellent flatness, the soft magnetic property of the ferromagnetic film 306 can be improved over that of the structure according to Example 1. For example, the coercivity of CoFeB after crystallization is reduced by half as compared with that of Example 1. The insulator film 305 is also formed as a flat film. However, because the antiferromagnetic film 301 is formed toward the top of the tunnel magnetoresistive device 2 in the direction in which the films are stacked, the orientation of the antiferromagnetic film 301 deteriorates as compared with that of Example 1. As a result, the anti-ferromagnetic coupling weakens and its heat-process resistance property deteriorates as compared with that of Example 1, and the tunnel magnetoresistance ratio tends to decrease by a heat process at 400° C. The method of manufacture of the tunnel magnetoresistive device 2 and the materials used for the various films thereof were the same as those of Example 1. The magnetoresistance ratio of the tunnel magnetoresistive device 2 was 200%, which was substantially the same as that of Example 1.

EXAMPLE 3

Figure 3:
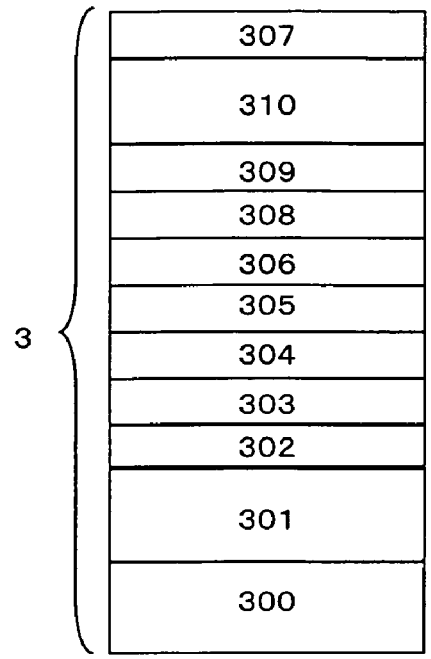
FIG. 3 shows a third example of the tunnel magnetoresistive device according to the invention.

FIG. 3 shows a schematic cross section of another example of the tunnel magnetoresistive device of the invention. The structure of the tunnel magnetoresistive device 3 is similar to that of the tunnel magnetoresistive device 1 shown in FIG. 1 with the exception that, on the ferromagnetic film 306, a non-ferromagnetic film 308, a ferromagnetic film 309, an antiferromagnetic film 310, and a protection film 307 were stacked sequentially in mentioned order.

In the present example, Ru (6 nm) was used in the non-ferromagnetic film 308, CoFe (2 nm) was used in the ferromagnetic film 309, and MnIr (8 nm) was used in the antiferromagnetic film 310. The composition ratio of CoFe of the ferromagnetic film 309 was selected such that the Co composition ranged between 50 to 90%, at which a stable antiferromagnetic coupling can be realized between the ferromagnetic film 309 and the antiferromagnetic film 310. For the non-ferromagnetic film 308, a material or film thickness other than Ru (6 nm) may be selected such that the magnetic bond between the ferromagnetic film 306 and the ferromagnetic film 309 disappears. The method for manufacturing the tunnel magnetoresistive device 3, and the materials used for the orientation control film 300, antiferromagnetic film 301, ferromagnetic film 302, non-ferromagnetic film 303, ferromagnetic film 304, insulator film 305, ferromagnetic film 306, and protection film 307 were the same as those used for Example 1. In particular, when CoFeB is used for the ferromagnetic film 306 and the ferromagnetic layer film 304, the resultant crystal structure is a body centered cubic structure, and the insulator film 305 is MgO having a rock-salt structure highly oriented in (100).

The magnetoresistance ratio obtained in the present example was 150%, which was a little smaller than that of Example 1. However, the efficiency of spin torque that acts on the ferromagnetic film 306 can be increased due to the spin-dependent reflection that takes place at the interface between the non-ferromagnetic film 308 and the ferromagnetic film 309. As a result, the threshold current density for spin-torque magnetization switching can be reduced by approximately two-thirds as compared with Example 1.

EXAMPLE 4

Figure 4:
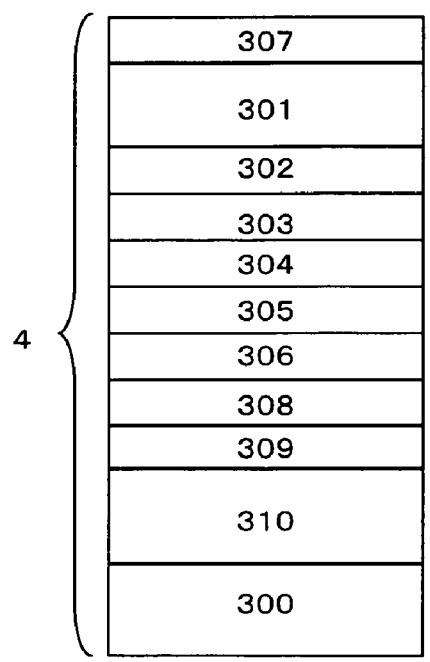
FIG. 4 shows a fourth example of the tunnel magnetoresistive device according to the invention.

FIG. 4 shows a schematic cross section of another example of the tunnel magnetoresistive device of the invention. A tunnel magnetoresistive device 4 is similar to the tunnel magnetoresistive device 2 of FIG. 2 with the exception that between the ferromagnetic film 306 and the orientation control film 300, an antiferromagnetic film 310, a ferromagnetic film 309, and a non-ferromagnetic film 308 are sequentially stacked in mentioned order from the side of the orientation control film 300.

In the present example, Ru (6 nm) was used for the non-ferromagnetic film 308, CoFe (2 nm) was used for the ferromagnetic film 309, and MnIr (8 nm) was used for the antiferromagnetic film 310. The composition ratio of CoFe of the ferromagnetic film 309 was selected such that the Co composition ranged between 50 to 90%, at which a stable antiferromagnetic coupling can be realized between the ferromagnetic film 309 and the antiferromagnetic film 310. For the non-ferromagnetic film 308, a material or film thickness other than Ru (6 nm) may be selected such that the magnetic bond between the ferromagnetic film 306 and the ferromagnetic film 309 disappears. The method for manufacture of the tunnel magnetoresistive device 4 and the materials used for the orientation control film 300, antiferromagnetic film 301, ferromagnetic film 302, non-ferromagnetic film 303, ferromagnetic film 304, insulator film 305, ferromagnetic film 306, and protection film 307 were the same as those for Example 2. In particular, when CoFeB is used in the ferromagnetic film 306 and the ferromagnetic layer film 304, the resultant crystal structure is a body centered cubic structure, and the insulator film 305 is MgO having a rock-salt structure highly oriented in (100).

The magnetoresistance ratio obtained in the present example was 140%, which was a little smaller than that of Example 2. However, the efficiency of spin torque that acts on the ferromagnetic film 306 can be increased due to the spin-dependent reflection that takes place at the interface between the non-ferromagnetic film 308 and the ferromagnetic film 309. As a result, the threshold current density during spin-torque magnetization switching can be reduced by approximately two-thirds as compared with Example 2.

EXAMPLE 5

Figure 5:
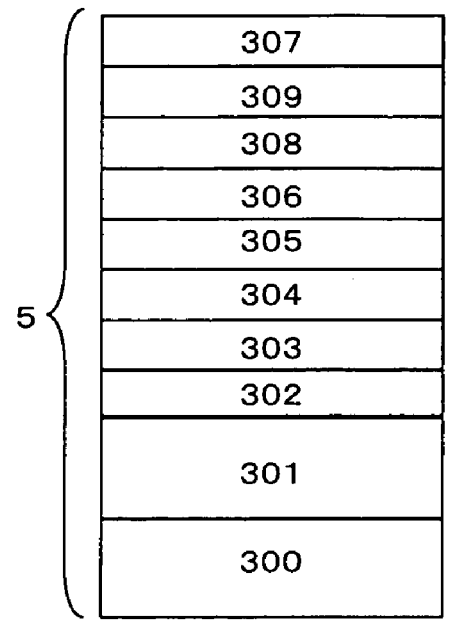
FIG. 5 shows a fifth example of the tunnel magnetoresistive device according to the invention.

FIG. 5 shows a schematic cross section of another example of the tunnel magnetoresistive device of the invention. A tunnel magnetoresistive device 5 is similar to the tunnel magnetoresistive device 3 of FIG. 3 with the exception that the device does not include the antiferromagnetic film 310.

In the present embodiment, Ru (8 nm) was used in the non-ferromagnetic film 308. For the non-ferromagnetic film 308, a material or a film thickness other than Ru (8 nm) may be selected such that the anti-ferromagnetic coupling between the ferromagnetic film 306 and ferromagnetic film 309 disappears. The method of manufacture of the tunnel magnetoresistive device 5 and the materials for the orientation control film 300, antiferromagnetic film 301, ferromagnetic film 302, non-ferromagnetic film 303, ferromagnetic film 304, insulator film 305, ferromagnetic film 306, ferromagnetic film 309, and protection film 307 were the same as those of Example 3. In particular, when CoFeB is used for the ferromagnetic film 306 and the ferromagnetic layer film 304, the resultant crystal structure is a body centered cubic structure, and the insulator film 305 is MgO having a rock-salt structure highly oriented in (100). The obtained magnetoresistance ratio was approximately 150%, which is substantially the same as that of Example 3.

In the present configuration, as in Example 3, the efficiency of the spin-transfer torque that acts on the ferromagnetic film 306 increases over Example 1, so that magnetization rotation utilizing the spin-transfer torque can be realized with a small current. Further, as compared with Example 3, the diffusion of Mn due to the heat process can be suppressed because of the lack of the antiferromagnetic film 310, so that the heat resistance of the magnetoresistance ratio can be improved.

EXAMPLE 6

Figure 6:
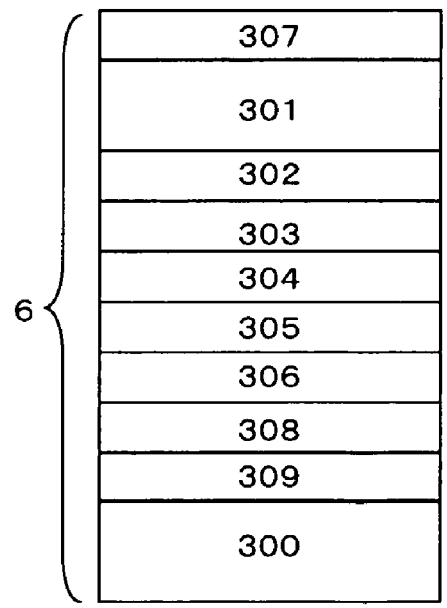
FIG. 6 shows a sixth example of the tunnel magnetoresistive device according to the invention.

FIG. 6 shows a schematic cross section of another example of the tunnel magnetoresistive device of the invention. A tunnel magnetoresistive device 6 is similar to the tunnel magnetoresistive device 4 of FIG. 4 with the exception that the antiferromagnetic film 310 is absent.

In the present example, Ru (8 nm) was used for the non-ferromagnetic film 308. For the non-ferromagnetic film 308, however, a material or film thickness other than Ru (8 nm) may be selected such that the anti-ferromagnetic coupling between the ferromagnetic film 306 and the ferromagnetic film 309 can disappear. The method of manufacture of the tunnel magnetoresistive device 6 and the materials used for the orientation control film 300, antiferromagnetic film 301, ferromagnetic film 302, non-ferromagnetic film 303, ferromagnetic film 304, insulator film 305, ferromagnetic film 306, ferromagnetic film 309, and protection film 307 were the same as those for Example 4. In particular, when CoFeB is used for the ferromagnetic film 306 and the ferromagnetic layer film 304, the resultant crystal structure is a body centered cubic structure, and the insulator film 305 is MgO having a rock-salt structure highly oriented in (100). The maximum magnetoresistance ratio obtained was approximately 140%, which was similar to that of Example 4.

In the present configuration, the efficiency of the spin-transfer torque that acts on the ferromagnetic film 306 increases over Example 4, so that magnetization rotation utilizing the spin-transfer torque can be realized with a smaller current. Further, as compared with Example 4, the diffusion of Mn due to the heat process can be suppressed by the lack of the antiferromagnetic film 310, so that the heat resistance of the magnetoresistance ratio can be increased.

EXAMPLE 7

Figure 7:
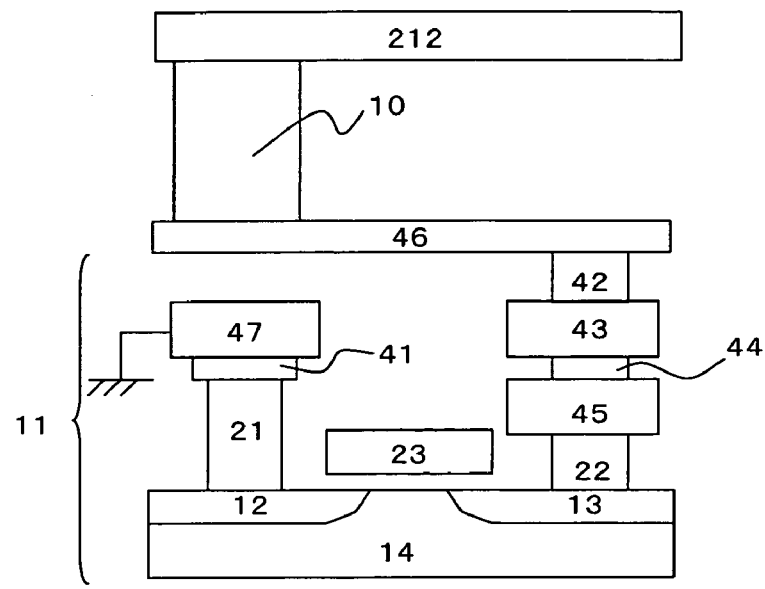
FIG. 7 shows an example of a magnetic memory cell according to the invention.

FIG. 7 shows a schematic cross section of an example of a magnetic memory cell according to the invention. The magnetic memory cell is equipped with the tunnel magnetoresistive device 10 according to Examples 1 to 6 as a memory cell.

C-MOS 11 is comprised of two n-type semiconductors 12 and 13 and one p-type semiconductor 14. To the n-type semiconductor 12, an electrode 21 is electrically connected that serves as a drain, which is connected to ground via electrodes 41 and 47. To the n-type semiconductor 13, an electrode 22 is electrically connected that severs as a source. Numeral 23 designates a gate electrode, by the ON/OFF switching of which the current between the source electrode 22 and the drain electrode 21 is ON/OFF controlled. On the source electrode 22, electrodes 45, 44, 43, 42, and 46 are stacked. Via the electrode 46, an orientation control film 300 of the tunnel magnetoresistive device 10 is connected.

A bit line 212 is connected to the protection film 307 of the tunnel magnetoresistive device 10. In the magnetic memory cell of the present example, the magnetization direction of the ferromagnetic film 306 of the tunnel magnetoresistive device 10 is rotated by the so-called spin-transfer torque due to the current that flows through the tunnel magnetoresistive device 10, whereby magnetic information is recorded. Alternatively, instead of using the spin-transfer torque, a current can be caused to flow through an electrode 47 that serves as both a bit line 212 and a word line, so that the magnetization direction of the ferromagnetic film 306 of the tunnel magnetoresistive device 10 is rotated by means of the magnetic field produced around the electrode, thereby recording magnetic information. When writing is performed using the spin-transfer torque, the power required for writing can be reduced to about one hundredths of the power required when a current magnetic filed is used.

Figure 9:
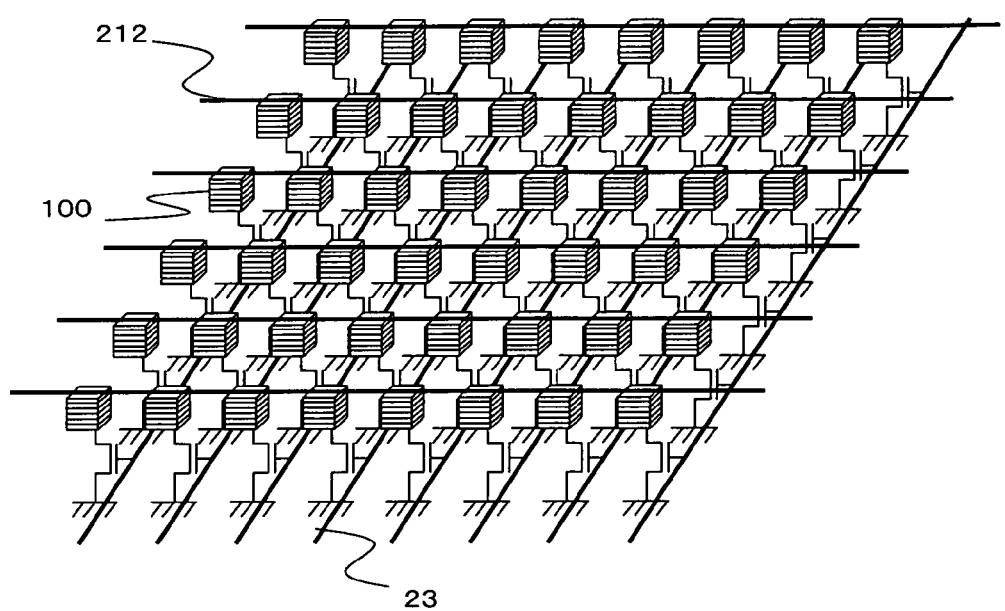
FIG. 9 shows an example of a magnetic memory cell according to the invention.

FIG. 9 shows an example of a nonvolatile magnetic memory in which the above magnetic memory cells are arranged. The gate electrode 23 and the bit line 212 are electrically connected to the memory cell 100. By arranging the magnetic memory cells according to the foregoing examples, the magnetic memory can be operated with low power consumption, thereby enabling the realization of a giga-bit class high-density magnetic memory.

What is claimed is:

1. A tunnel magnetoresistive device comprising an insulator film, and first and second ferromagnetic films between which the insulator film is disposed,
    wherein the first ferromagnetic film comprises a film of a body-centered cubic structure containing Co, Fe, and B, wherein the composition ratio of Fe relative to Co is greater than 50 atm % and less than 100 atm % and wherein the insulator film comprises a MgO film of a rock-salt structure oriented in (100).

2. The tunnel magnetoresistive device according to claim 1, wherein the second ferromagnetic film comprises a film of a body-centered cubic structure containing Co, Fe, and B.

3. The tunnel magnetoresistive device according to claim 1, comprising an orientation control film on which an antiferromagnetic film, a third ferromagnetic film, and a non-ferromagnetic film are sequentially stacked, wherein the first ferromagnetic film, the insulator film, and the second ferromagnetic film are sequentially stacked on the non-ferromagnetic film,
    wherein the magnetization direction of the third ferromagnetic film is fixed by the antiferromagnetic film, and wherein the third ferromagnetic film and the first ferromagnetic film are antiferromagnetically coupled via the non-ferromagnetic film.

4. The tunnel magnetoresistive device according to claim 3, wherein, on the second ferromagnetic film, a second non-ferromagnetic film, a fourth ferromagnetic film, and a second antiferromagnetic film are sequentially stacked in mentioned order, wherein the magnetization direction of the fourth ferromagnetic film is fixed by the second antiferromagnetic film.

5. The tunnel magnetoresistive device according to claim 3, wherein, on the second ferromagnetic film, a second non-ferromagnetic film and a fourth ferromagnetic film are sequentially stacked in mentioned order.

6. The tunnel magnetoresistive device according to claim 1, comprising an orientation control film on which the first ferromagnetic film, the insulator film, and the second ferromagnetic film are sequentially stacked,
    wherein, on the second ferromagnetic film, a non-ferromagnetic film, a third ferromagnetic film, and an antiferromagnetic film are sequentially stacked,
    wherein the magnetization direction of the third ferromagnetic film is fixed by the antiferromagnetic film, and wherein the third ferromagnetic film and the first ferromagnetic film are antiferromagnetically coupled via the non-ferromagnetic film.

7. The tunnel magnetoresistive device according to claim 6, wherein, between the orientation control film and the first ferromagnetic film, a second antiferromagnetic film, a fourth ferromagnetic film, and a second non-ferromagnetic film are sequentially stacked in mentioned order, wherein the magnetization direction of the fourth ferromagnetic film is fixed by the second antiferromagnetic film.

8. The tunnel magnetoresistive device according to claim 6, wherein, between the orientation control film and the first ferromagnetic film, a fourth ferromagnetic film and a second non-ferromagnetic film are sequentially stacked in mentioned order.

9. A magnetic memory comprising a tunnel magnetoresistive device, and a switching element for controlling the ON/OFF of a current that flows through the tunnel magnetoresistive device,
    wherein the tunnel magnetoresistive device comprises an insulator film, and first and second ferromagnetic films between which the insulator film is disposed, wherein the first ferromagnetic film comprises a film of a body-centered cubic structure containing Co, Fe, and B, wherein the composition ratio of Fe relative to Co is greater than 50 atm % and less than 100 atm %, and wherein the insulator film comprises a MgO film of a rock-salt structure oriented in (100).

10. The magnetic memory according to claim 9, wherein the second ferromagnetic film comprises a film of a body-centered cubic structure containing Co, Fe, and B.

11. The magnetic memory according to claim 9, wherein magnetic information is recorded using spin-transfer torque.

12. A magnetic random access memory comprising a plurality of magnetic memory cells and a means for selecting a desired magnetic memory cell, wherein the magnetic memory cells include a tunnel magnetoresistive device in which a first ferromagnetic film of a body-centered cubic structure containing Co, Fe, and B, wherein the composition ratio of Fe relative to Co is greater than 50 atm % and less than 100 atm %, and wherein a MgO insulator film of a rock-salt structure oriented in (100), and a second ferromagnetic film are stacked.

13. The magnetic random access memory according to claim 12, wherein the second ferromagnetic film comprises a film of a body-centered cubic structure containing Co, Fe, and B.

14. The magnetic random access memory according to claim 12, wherein magnetic information is recorded using spin-transfer torque.

15. The tunnel magnetoresistive device according to claim 1, wherein the insulator film is formed on the second ferromagnetic film, and the first ferromagnetic film is formed on the insulator film.

16. The tunnel magnetoresistive device according to claim 1, wherein the insulation film is crystalline.

17. The tunnel magnetoresistive device according to claim 1, wherein the first and second ferromagnetic films are crystalline.

* * * * *

UNITED STATES PATENT AND TRADEMARK OFFICE
CERTIFICATE OF CORRECTION

PATENT NO. : 7,468,542 B2
APPLICATION NO. : 11/493892
DATED : December 23, 2008
INVENTOR(S) : J. Hayakawa et al.

Page 1 of 1

It is certified that error appears in the above-identified patent and that said Letters Patent is hereby corrected as shown below:

Please correct Assignees as shown below:

Title page, item (73) Assignee, add the following Assignee:

After Hitachi, Ltd., Tokyo (JP), please add: -- Tohoku University, Miyagi (JP) --.

Signed and Sealed this

Twenty-third Day of March, 2010

David J. Kappos
*Director of the United States Patent and Trademark Office*